(12) United States Patent
Boyd et al.

(10) Patent No.: US 7,396,430 B2
(45) Date of Patent: Jul. 8, 2008

(54) APPARATUS AND METHOD FOR CONFINED AREA PLANARIZATION

(75) Inventors: John M. Boyd, Hillsboro, OR (US);
Fritz C. Redeker, Fremont, CA (US);
Yezdi Dordi, Palo Alto, CA (US);
Michael Ravkin, Sunnyvale, CA (US);
John de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 13 days.

(21) Appl. No.: 11/395,881

(22) Filed: Mar. 31, 2006

(65) Prior Publication Data
US 2007/0227656 A1   Oct. 4, 2007

(51) Int. Cl.
*H01L 21/306* (2006.01)
(52) U.S. Cl. .................. 156/345.12; 156/1; 438/692; 204/194
(58) Field of Classification Search ......... 438/692, 438/693; 156/345.12, 345.1, 12; 204/194, 204/224
See application file for complete search history.

(56) References Cited
U.S. PATENT DOCUMENTS

2004/0038543 A1 *  2/2004  Zahorik et al. ............. 438/705
2007/0051639 A1 *  3/2007  Mazur et al. ................ 205/666

* cited by examiner

*Primary Examiner*—Lan Vinh
(74) *Attorney, Agent, or Firm*—Martine Penilla & Gencarella, LLP

(57) ABSTRACT

A proximity head and associated method of use is provided for performing confined area planarization of a semiconductor wafer. The proximity head includes a chamber defined to maintain an electrolyte solution. A cathode is disposed within the chamber in exposure to the electrolyte solution. A cation exchange membrane is disposed over a lower opening of the chamber. A top surface of the cation exchange membrane is in direct exposure to the electrolyte solution to be maintained within the chamber. A fluid supply channel is defined to expel fluid at a location adjacent to a lower surface of the cation exchange membrane. A vacuum channel is defined to provide suction at a location adjacent to the lower surface of the cation exchange membrane, such that the fluid to be expelled from the fluid supply channel is made to flow over the lower surface of the cation exchange membrane.

13 Claims, 11 Drawing Sheets

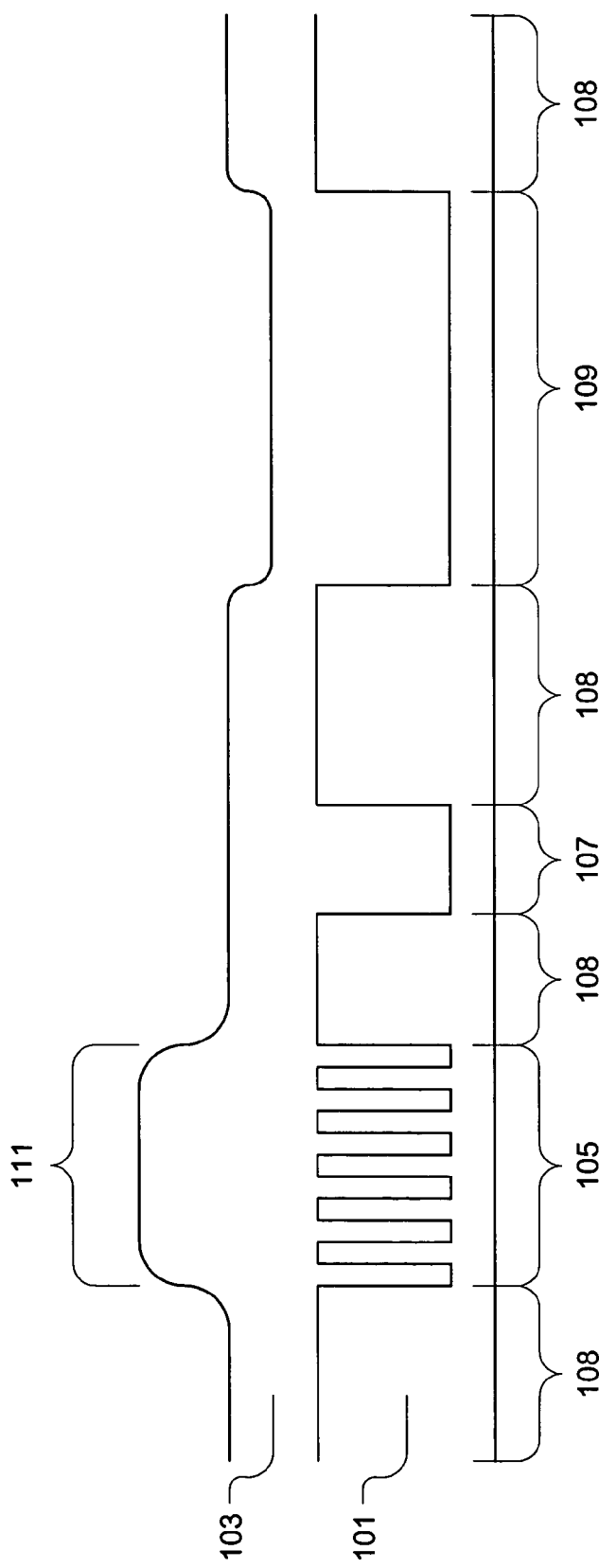

APPARATUS AND METHOD FOR CONFINED AREA PLANARIZATION

CROSS REFERENCE TO RELATED APPLICATIONS

This application is related to U.S. patent application Ser. No. 11/394,777, filed on Mar. 31, 2006, and entitled "Apparatus and Method for Semiconductor Wafer Electroplanarization," and U.S. patent application Ser. No. 10/879,263, filed on Jun. 28, 2004, and entitled "Method and Apparatus for Plating Semiconductor Wafers," and U.S. patent application Ser. No. 10/879,396, filed on Jun. 28, 2004, and entitled "Electroplating Head and Method for Operating the Same." The disclosure of each of these related applications is incorporated herein by reference.

BACKGROUND OF THE INVENTION

In the fabrication of semiconductor devices such as integrated circuits, memory cells, and the like, a series of manufacturing operations are performed to define features on semiconductor wafers. The semiconductor wafers include integrated circuit devices in the form of multi-level structures defined on a silicon substrate. At a substrate level, transistor devices with diffusion regions are formed. In subsequent levels, interconnect metalization lines are patterned and electrically connected to the transistor devices to define a desired integrated circuit device. Also, patterned conductive layers are insulated from other conductive layers by dielectric materials.

During conductive interconnect manufacturing, a metal layer is deposited on the wafer. The deposited metal will fill regions on the wafer between smaller features, such as sub-micron features, faster than larger regions, such as trench regions. Because the smaller features may span relatively large areas of the wafer, it should be appreciated that these large areas of the wafer may have an increased topography. The increased topography regions need to be planarized in conjunction with planarization of the decreased topography regions. Simultaneous planarization of both the increased and decreased topography areas of the wafer poses a challenge. For example, to achieve sufficient planarization of the increased topography areas of the wafer, an extended over-polishing period may be required. However, exposure of the decreased topography areas of the wafer to this extended overpolishing period may cause removal of too much material from the decreased topography areas, e.g., the barrier layer underlying the deposited metal may be undesirably exposed and/or damaged.

SUMMARY OF THE INVENTION

In one embodiment, a proximity head is disclosed for confined area planarization of a semiconductor wafer. The proximity head includes a chamber defined to maintain an electrolyte solution. A cathode is disposed within the chamber in exposure to the electrolyte solution. A cation exchange membrane is disposed over a lower opening of the chamber, such that a top surface of the cation exchange membrane is in direct exposure to the electrolyte solution to be maintained within the chamber. The proximity head also includes a fluid supply channel defined to expel fluid at a location adjacent to a lower surface of the cation exchange membrane. Additionally, a vacuum channel is defined to provide suction at a location adjacent to the lower surface of the cation exchange membrane, such that fluid to be expelled from the fluid supply channel is made to flow over the lower surface of the cation exchange membrane.

In another embodiment, a method is disclosed for confined area planarization of a semiconductor wafer. The method includes an operation for disposing a proximity head over and proximate to a top surface of a semiconductor wafer, such that a cation exchange membrane of the proximity head faces the top surface of the semiconductor wafer. The method also includes an operation for disposing an electrolyte solution between a top surface of the cation exchange membrane and a cathode. The method further includes flowing deionized water between a bottom surface of the cation exchange membrane and the top surface of the semiconductor wafer. A bias voltage is then applied between the top surface of the semiconductor wafer and the cathode, such that cations liberated from the top surface of the semiconductor wafer are influenced to travel through the deionized water, through the cation exchange membrane, and through the electrolyte solution to the cathode.

In another embodiment, a proximity head is disclosed for confined area planarization of a semiconductor wafer. The proximity head includes a chamber defined to maintain an electrolyte solution. A cathode is disposed within the chamber in exposure to the electrolyte solution. A cation exchange membrane is disposed over a lower opening of the chamber and in direct exposure to the electrolyte solution to be maintained within the chamber. The proximity head further includes a fluid supply channel defined to expel fluid at a location adjacent to a lower surface of the cation exchange membrane. Also, a vacuum channel is defined to provide suction at a location adjacent to the lower surface of the cation exchange membrane, such that the fluid to be expelled from the fluid supply channel is made to flow over the lower surface of the cation exchange membrane. Additionally, an electric current measuring device is connected to measure an electric current flow through the cation exchange membrane. The measured electric current enables detection of a planarization endpoint.

In another embodiment, a method is disclosed for detecting a planarization endpoint in a confined area planarization process. The method includes an operation for disposing a proximity head over and proximate to a top surface of a semiconductor wafer, such that a cation exchange membrane of the proximity head faces the top surface of the semiconductor wafer. The method also includes an operation for disposing an electrolyte solution between a top surface of the cation exchange membrane and a cathode. The method further includes flowing deionized water between a bottom surface of the cation exchange membrane and the top surface of the semiconductor wafer. A bias voltage is then applied between the top surface of the semiconductor wafer and the cathode, such that cations liberated from the top surface of the semiconductor wafer are influenced to travel through the deionized water, through the cation exchange membrane, and through the electrolyte solution to the cathode. The method further includes an operation for monitoring a flow of electric current through the cation exchange membrane to detect an endpoint of a planarization process. The endpoint of the planarization process occurs when the monitored flow of electric current is observed to level-off.

In another embodiment, a proximity head is disclosed for confined area planarization of a semiconductor wafer. The proximity head includes a chamber defined to maintain an electrolyte solution. A cathode is disposed within the chamber in exposure to the electrolyte solution. A cation exchange membrane is disposed over a lower opening of the chamber, such that a top surface of the cation exchange membrane is in direct exposure to the electrolyte solution to be maintained within the chamber. The proximity head also includes a fluid supply channel defined to expel fluid at a location adjacent to a lower surface of the cation exchange membrane. The fluid to be expelled from the fluid supply channel is made to flow over the lower surface of the cation exchange membrane.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 1 is a simplified schematic diagram illustrating a silicon substrate having a copper layer deposited thereon;

DETAILED DESCRIPTION

Figure 2A:
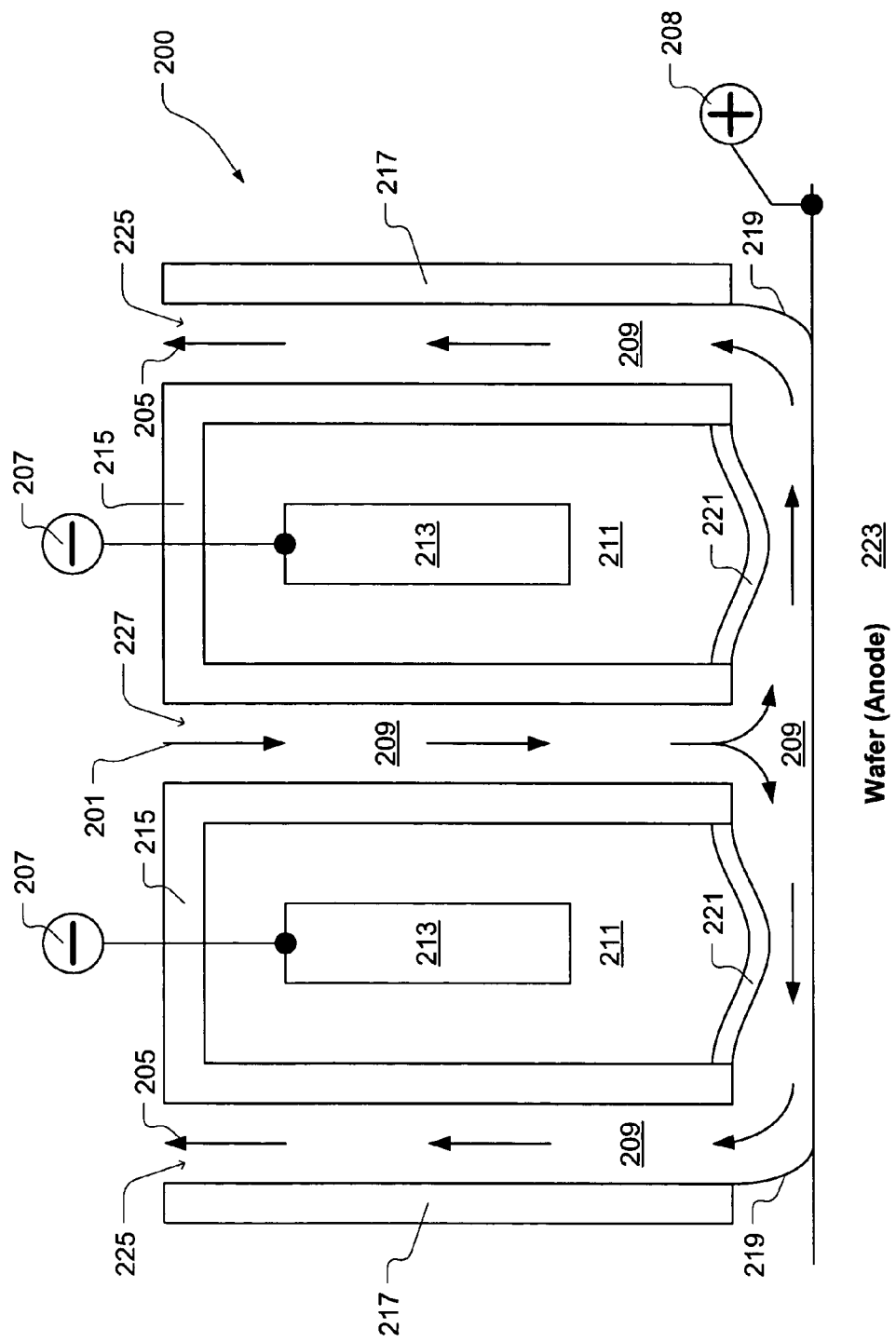
FIG. 2A is an illustration showing a vertical cross-sectional view of a proximity head positioned over and proximate to a wafer to be planarized, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

During copper interconnect manufacturing on a semiconductor wafer ("wafer"), a copper layer may be deposited on a seed/barrier layer using an electroplating process. Components in the electroplating solution provide for appropriate gap fill on sub-micron features. However, these sub-micron features tend to plate faster than the bulk areas and larger trench regions, i.e., greater than 1 micron. The sub-micron regions are typically found in large memory arrays such as static random access memory (SRAM), and can span large areas of the wafer. It should be appreciated that this causes large areas of the wafer to have additional topography that needs to be planarized, in addition to the larger trench regions that also need to be planarized.

FIG. 1 is a simplified schematic diagram illustrating a silicon substrate having a copper layer deposited thereon. A copper layer 103 is deposited on a seed/barrier layer (not shown for clarity reasons) disposed over a wafer 101 using an electroplating process. As previously mentioned, components in the electroplating solution provide for good gap fill on sub-micron features, such as sub-micron trenches in region 105, but these features tend to plate faster than the bulk areas and trench regions 107 and 109. High regions or "steps" in the topography of the substrate, illustrated by region 111, result over the sub-micron trench region 105. These steps are also referred to as "superfill" regions. The superfill region 111 is defined by thicker copper film than field regions 108 and trench regions 107 and 109. The superfill region 111 must be planarized in conjunction with the topography over the field regions 108 and trench regions 107 and 109.

Current planarization techniques are not suited to handle the superfill topography in an efficient manner, i.e., planarization techniques are sensitive to pattern density and circuit layout. More specifically, chemical mechanical planarization (CMP) processes often must be tuned according to the incoming wafer properties. Therefore, changes are made to the CMP process (such as changing step times, overpolish time, or endpoint algorithms, for example) in order to accommodate variations within or between wafer lots. Also, such changes are made to the CMP process to accommodate different pattern densities and circuit layouts encountered on wafers of mixed-product manufacturing lines.

When attempting to perform a single CMP process on the topography having superfill regions, excessive dishing and erosion can occur in trench regions 107 and 109 when overpolishing is performed in order to completely remove the remaining copper from the superfill region 111. Additionally, not only is the CMP process required to remove the excess copper in the superfill region 111, but the CMP process is also required to perform this removal in a manner that follows a contour of the wafer. The contour of the wafer is due to waviness inherent in the silicon substrate of the wafer. The waviness is typically on the order of 0.2 micron to 0.5 micron total thickness variation. Current CMP processes do not suitably deal with both superfill region topography and wafer contour, while effectively planarizing other topography in the trench and field regions. Furthermore, the cost of consumables and waste treatment of the CMP process effluent (typically acid or alkaline chemistry containing Cu and solid waste) is high.

The present invention provides an apparatus and method for performing confined area planarization (CAP) of a wafer using electroplanarization with minimal chemical effluent in the waste stream. More specifically, a proximity head is used to establish a closed-loop cathode half-cell relationship with the surface of the wafer to be planarized. FIG. 2A is an illustration showing a vertical cross-sectional view of a proximity head 200 positioned over and proximate to a wafer 223 to be planarized, in accordance with one embodiment of the present invention. The proximity head 200 structure includes an electrolyte chamber structure 215 and a peripheral structure 217. The electrolyte chamber structure 215 is defined to hold an electrolyte solution 211 therein. In various embodiments the electrolyte solution 211 can be static or circulated. A deionized water supply channel 227 is formed between opposing internal walls of the electrolyte chamber structure 215 and near the center of the proximity head 200. A vacuum channel 225 is formed between the outer walls of the electrolyte chamber structures 215 and the peripheral structure 217. It should be appreciated that the electrolyte chamber structure 215 and peripheral structure 217 can be formed from essentially any material having sufficient mechanical strength and sufficient chemical compatibility with interfacing materials.

Figure 2B:
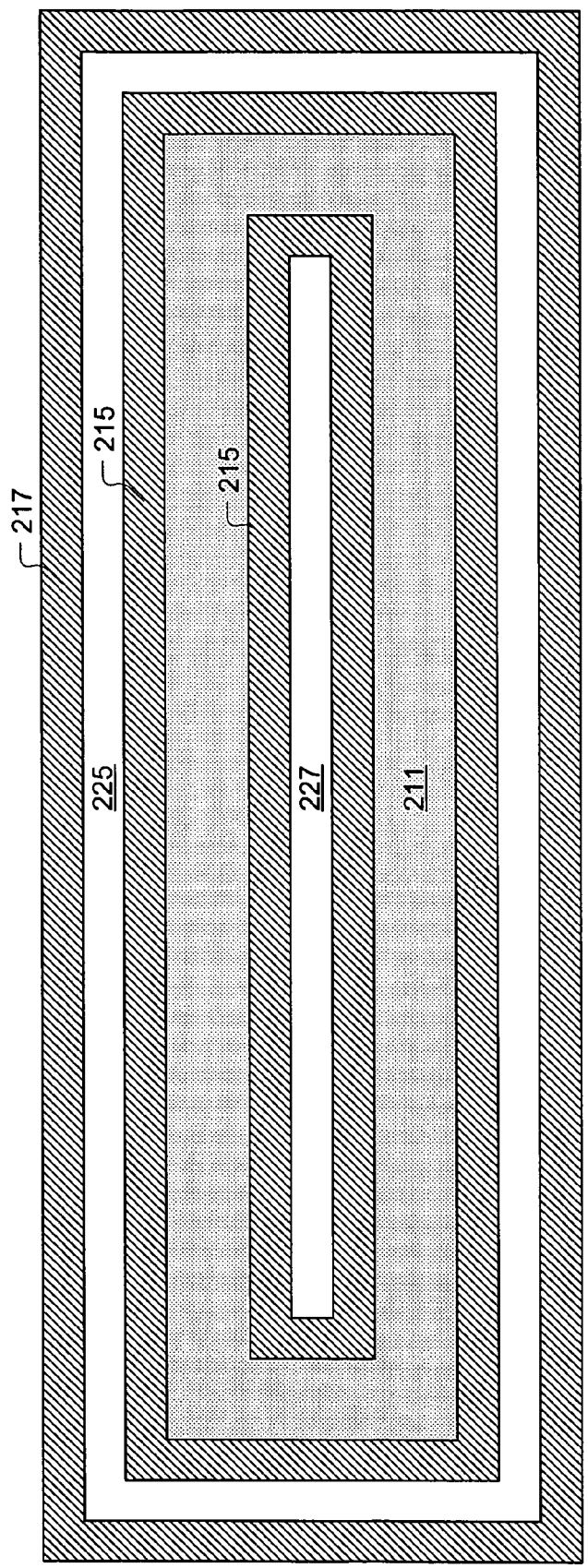
FIG. 2B is an illustration showing a horizontal cross-sectional view of the proximity head of FIG. 2A, in accordance with one embodiment of the present invention.

FIG. 2B is an illustration showing a horizontal cross-sectional view of the proximity head 200 of FIG. 2A, in accordance with one embodiment of the present invention. The electrolyte chamber structure 215 is shown as having an annular-shape, with the deionized water supply channel 227 defined within the center of the annular-shaped electrolyte chamber structure 215. The peripheral structure 217 is defined to surround the electrolyte chamber structure 215 in a spaced-apart relationship therewith. Therefore, the peripheral structure 217 is also annular-shaped. As shown, the vacuum channel 225 is defined between the electrolyte chamber structure 215 and the peripheral structure 217. It should be appreciated that the vacuum channel 225 surrounds a perimeter of the electrolyte chamber structure 215.

With reference to FIG. 2A, a bottom of the electrolyte chamber 215 is defined by a one-way cation exchange membrane 221. The membrane 221 functions to contain the electrolyte solution 211 within the electrolyte chamber 215. In one embodiment, the membrane 221 is defined to have a thickness of about 0.050 inch. During operation, deionized water 209 is supplied through the deionized water supply channel 227, as indicated by arrow 201. The supplied deionized water 209 flows between the proximity head 200 and the wafer 223, over the membrane 221, and up through the vacuum channel 225, as indicated by arrow 205. In one embodiment, the membrane 221 is defined to have a width within a range extending from about 0.25 inch to about 2 inches. The width of the membrane 221 corresponds to the linear distance through which the deionized water flows from the supply channel 227 to reach the vacuum channel 225. It should be appreciated that a substantially complete amount of the deionized water 209 is returned through the vacuum channel 225, thus forming a meniscus of deionized water 209 between the proximity head 200 and the wafer 223. A periphery of the meniscus of deionized water is defined by a meniscus boundary 219.

A cathode 213 is positioned within the electrolyte chamber 215. The cathode 213 is electrically connected to a bias voltage supply 207. The surface of the wafer 223 in exposure to the deionized water 209 represents an anode and is electrically connected to a bias voltage supply 208. The wafer (anode) is maintained at a positive bias voltage with respect to the cathode 213. Thus, positively charged ions will be attracted from the wafer 223 toward the cathode 213. In one embodiment, the bias voltage between the wafer 223 and the cathode 213 is maintained within a range extending from about 10 V to about 25 V.

Figure 2C:
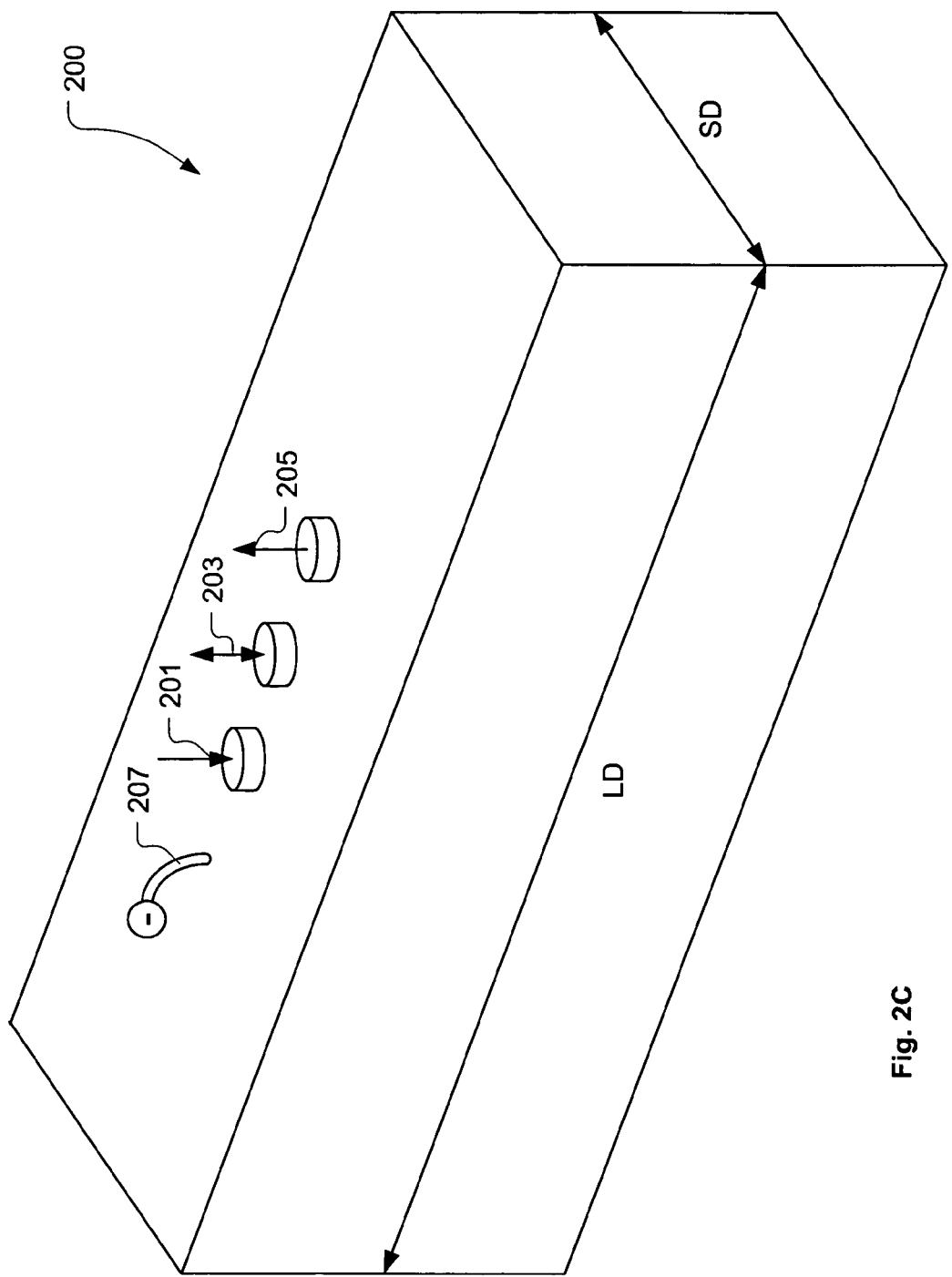
FIG. 2C is an illustration showing an exterior view of the proximity head, in accordance with one embodiment of the present invention.

FIG. 2C is an illustration showing an exterior view of the proximity head 200, in accordance with one embodiment of the present invention. The proximity head 200 has a rectangular shape defined by a long dimension (LD) and a short dimension (SD). Thus, the meniscus of deionized water 209 between the proximity head 200 and the wafer 223 is defined to have a substantially rectangular shape. In one embodiment, the long dimension (LD) of the proximity head 200 exceeds a diameter of the wafer 223, and the short dimension (SD) is less than the diameter of the wafer 223. Therefore, once the proximity head 200 has completely traversed over and proximate to the upper surface of the wafer 223 in the direction of the short dimension (SD), the entire upper surface of the wafer will have been exposed to the meniscus of deionized water beneath the proximity head 200.

Although the proximity head 200 is described herein as having the annular-shaped electrolyte chamber structure 215 and corresponding annular-shaped vacuum channel 225, it should be appreciated that other embodiments of the proximity head 200 can include other geometric configurations for the electrolyte chamber 215 and vacuum channel 225. However, regardless of the specific geometric configuration of the proximity head 200, it should be understood that the deionized water should be controlled to flow over the membrane 221 within the meniscus established between the proximity head 200 and wafer 223. In one embodiment the deionized water 209 flows between the membrane 221 and the wafer 223 at a rate within a range extending from about 100 mL/min to about 2000 mL/min.

Figure 2D:
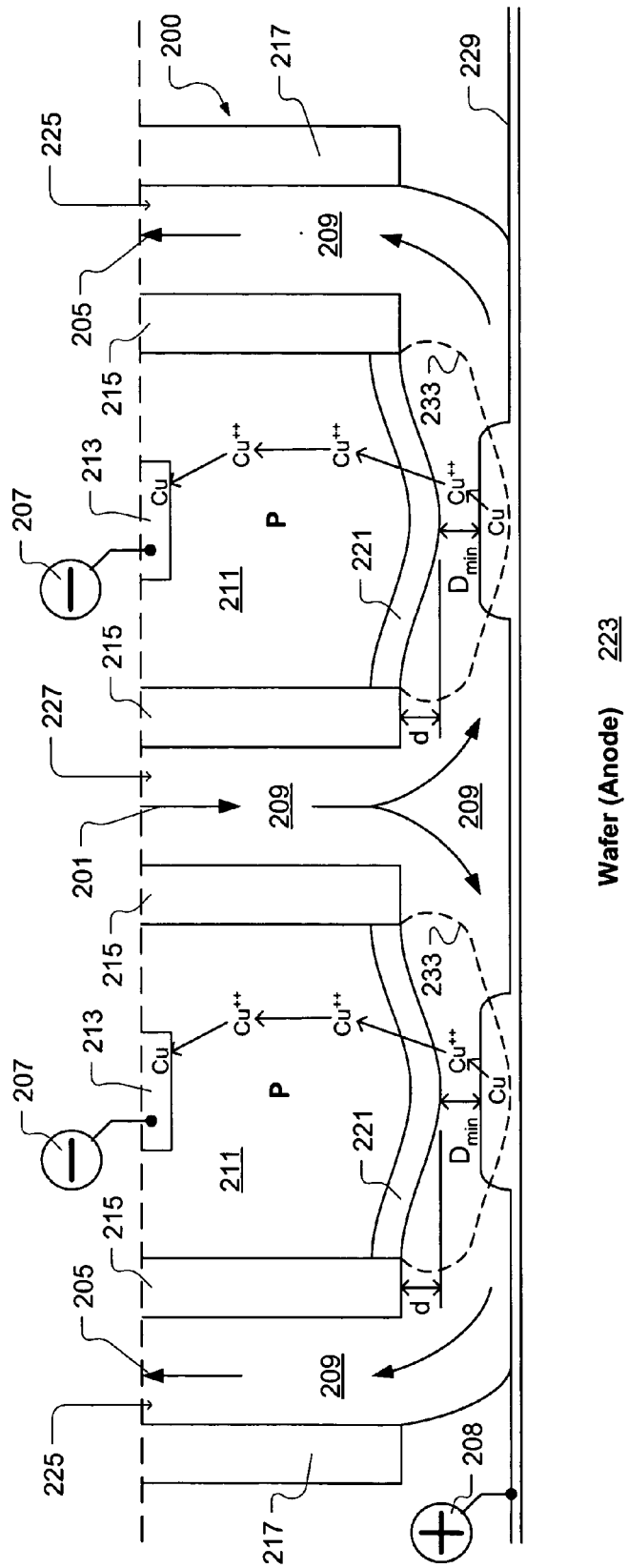
FIG. 2D is an illustration showing the proximity head electropolishing functionality that enables confined area planarization of the wafer, in accordance with one embodiment of the present invention.

FIG. 2D is an illustration showing the proximity head 200 electropolishing functionality that enables confined area planarization of the wafer 223, in accordance with one embodiment of the present invention. The membrane 221 is defined as a polymer matrix including functional groups that form a network of channels through which cations can travel. In one embodiment, the membrane 221 is defined by a teflon base including sulfonic acid functional groups. In general, the membrane 221 is not permeable to wafer. However, water molecules can be "dragged" along with cations through the network of the functional groups. The membrane 221 allows cations to pass through the network of functional groups, while preventing anions from passing through the network of functional groups. Thus, the membrane 221 is a one-way cation exchange membrane.

Under the influence of an appropriate bias voltage cations will readily move through the membrane 221. Therefore, the membrane 221 is suitable for use in an electroplanarization process for removing metal, e.g., copper, from the wafer 223. Specifically, metal cations, e.g., $Cu^{++}$ cations, can be made to move from the wafer 223, i.e., anode, to the cathode 213 under the influence of a bias voltage applied between the wafer 223 and the cathode 213. As shown in FIG. 2D, the membrane 221 is separated from the wafer 223 by the deionized water 209. Thus, the deionized water 209 provides a medium for transport of the metal cations, e.g., $Cu^{++}$ cations, from the wafer 223 to the membrane 221. Upon reaching the membrane 221, the metal cations can pass through the network of functional groups to reach the electrolyte solution 211. Upon reaching the electrolyte solution 211, the metal cations will travel to the cathode 213 and be plated on the cathode 213.

In addition to providing a network of cation exchange pathways, the functional groups, e.g., the sulfonic acid groups, within the membrane 221 also serve to modify a pH of the deionized water 209 within a vicinity of the membrane 221. The region of the deionized water 209 that is pH-influenced by the membrane 221 represents a critical boundary layer 233, as depicted by the dashed lines in FIG. 2D. The pH of the deionized water 209 within the critical boundary layer 233 is sufficiently influenced by the functional groups of the membrane 221 to enable etching of a metalized topography 229 on the top surface of the wafer 223, when the metalized topography 229 is exposed to the critical boundary layer 233. It should be appreciated that the pH influence exerted by the membrane 221 on the deionized water 209 within the critical boundary layer 233 drops within distance from the membrane 221. Therefore, etching reactions will occur at a faster rate within portions of the critical boundary layer 233 that are closer to the membrane 221.

Under the influence of the bias voltage applied between the cathode 213 and the anode, i.e., the metalized topography on the surface of the wafer 223, metal cations such as $Cu^{++}$ that are liberated in the etching reactions within the critical boundary layer 233 will be coordinated to 2-3 molecules of water, directed through the membrane 221 and be plated on the cathode 213. Thus, exposure of the metalized topography 229 of the wafer 223 to the critical boundary layer underlying the membrane 221 will enable planarization of the metalized topography 229. As the wafer 223 traverses beneath the proximity head 200, and the membrane 221 thereof, higher topographical features on the surface of the wafer 223 will be closer to the membrane 221, and will therefore be etched at a higher rate relative to lower topographical features on the surface of the wafer 223. Thus, the more rapid etching of the higher topographical features on the surface of the wafer 223 enables the metalized topography 229 of the wafer 223 to be planarized in a substantially top-down manner.

To enable exposure of the metalized topography 229 to the critical boundary layer 233, the membrane 221 needs to be brought within close enough proximity to the wafer 223. However, if the membrane is brought too close to the wafer 223, the membrane will be attracted to wafer 223 and will adhere to the wafer 223. Direct contact between the membrane 221 and the wafer 223 is not desirable because the functional groups, e.g., sulfonic acid groups, of the membrane 221 will etch the metal from the wafer 223 too fast, causing dehydration of the water in the contact region and suction of the membrane to the substrate, resulting in damage to the wafer 223. Additionally, physical contact between the membrane 221 and the wafer 223 may physically damage the membrane 221 and/or wafer 223. To ensure that the membrane 221 does not adhere to the wafer 223, a minimum distance ($D_{min}$) must be maintained between the membrane 221 and the wafer 223.

In combination with the need to maintain the minimum distance ($D_{min}$) between the membrane 221 and the wafer 223, it is also necessary to expose the surface of the wafer 223 to the critical boundary layer 233. The critical boundary layer 233 thickness required for planarizing the wafer 223 may be on the order of tenths or hundredths of microns. It is simply not feasible to control the physical separation between the proximity head 200 and the wafer 223 to within a fraction of a micron. Additionally, because the etch rate increases as the membrane 221 get closer to the wafer 223, it is also necessary to control the uniformity of the separation distance between membrane 221 and the wafer 223. Thus, it is necessary for the separation distance between the membrane 221 and the wafer 223 to be adaptable to contour variations across the wafer 223, and preferably self-limiting.

Despite limitations associated with controlling the physical separation between the proximity head 200 and the wafer 223, the mechanical characteristics of the membrane 221 enables exposure of the wafer 223 to the critical boundary layer 233 in a substantially uniform manner. More specifically, the proximity head 200 can be positioned within close enough proximity to the wafer 223, such that a controlled flexing of the membrane 221 toward the wafer 223 will enable exposure of the wafer 223 to the critical boundary layer 233, without allowing the membrane 221 to contact the wafer 223. A pressure (P) of the electrolyte solution 211 in combination with a Bernoulli effect caused by the deionized water 209 flow over the membrane 221 is capable of causing the membrane to flex through a distance (d) toward the wafer 223.

The proximity head 200 is capable of maintaining the deionized water 209 meniscus between the membrane 221 and the wafer 223 at a substantially fixed thickness. In one embodiment, the physical separation between proximity head 200 and the wafer 223 is controlled to be within a range extending from about 0.5 mm to about 2 mm. As previously discussed, the deionized water 209 is delivered from supply channel 227 near the center of the proximity head 200 and made to flow over the membrane 221 to the vacuum channel 225 near the periphery of the proximity head 200. The Bernoulli effect caused by the flow of deionized water 209 over the membrane 221 causes the membrane 221 to flex toward the wafer 223. The amount of membrane 221 flex caused by the flow of deionized water 209 is dependent on the flow rate of the deionized water. Thus, the flow rate of deionized water 209 can be used to control the membrane 221 flex distance (d). The electrolyte solution 211 pressure (P) can also affect the membrane 221 flex distance (d).

In accordance with the foregoing, the physical separation between the proximity head 200 and the wafer 223 can be controlled in a coarse manner relative to the critical boundary layer 233 thickness. Then, the electrolyte solution 211 pressure (P) and deionized water 209 flow rate can be adjusted to provide fine control of the membrane 221 flex distance (d), such that the separation distance between the membrane 221 and the wafer 223 is finely controlled. In one embodiment, the electrolyte solution 211 pressure (P) is maintained within a range extending from about 0 psig to about 10 psig.

It is conceivable the a contour, i.e., waviness, inherent in the wafer 223 may exceed the critical boundary layer 233 thickness. However, the ability of the membrane 221 to flex enables the membrane 221 to conform to the contour of the wafer 223, such that a uniform separation distance is maintained between the membrane 221 and the wafer 223. In other words, the flexibility of the membrane 221 combined with the control afforded by the electrolyte solution 211 pressure (P) and the deionized wafer 209 flow rate, enables the membrane 221 to follow the contour of the wafer 223 as the proximity head 200 and wafer 223 move with respect to each other.

Figure 3A:
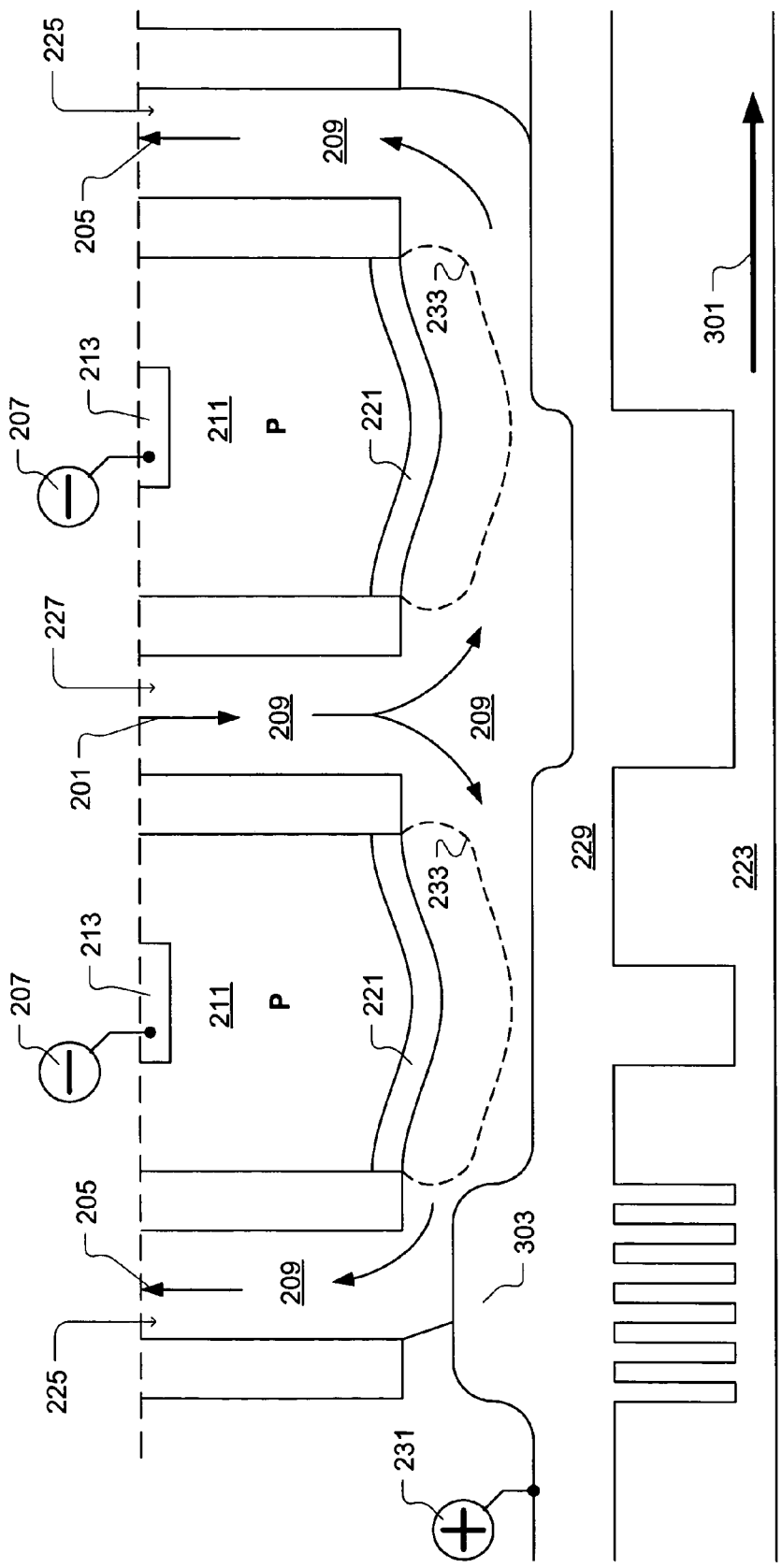
FIGS. 3A-3C are a series of illustrations showing traversal of a wafer beneath the proximity head during the confined area planarization process, in accordance with one embodiment of the present invention.
Figure 3B:
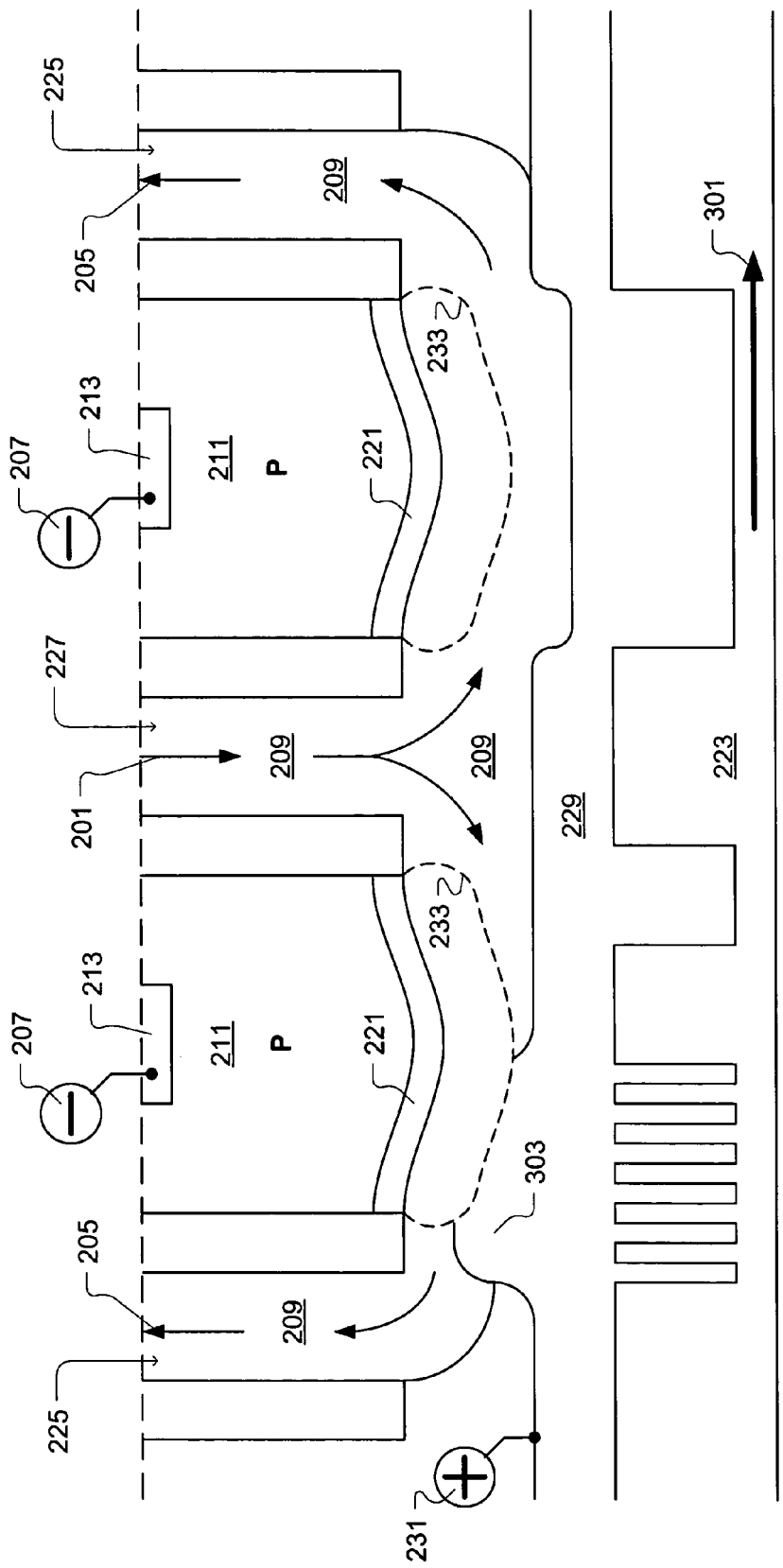
Figure 3C:
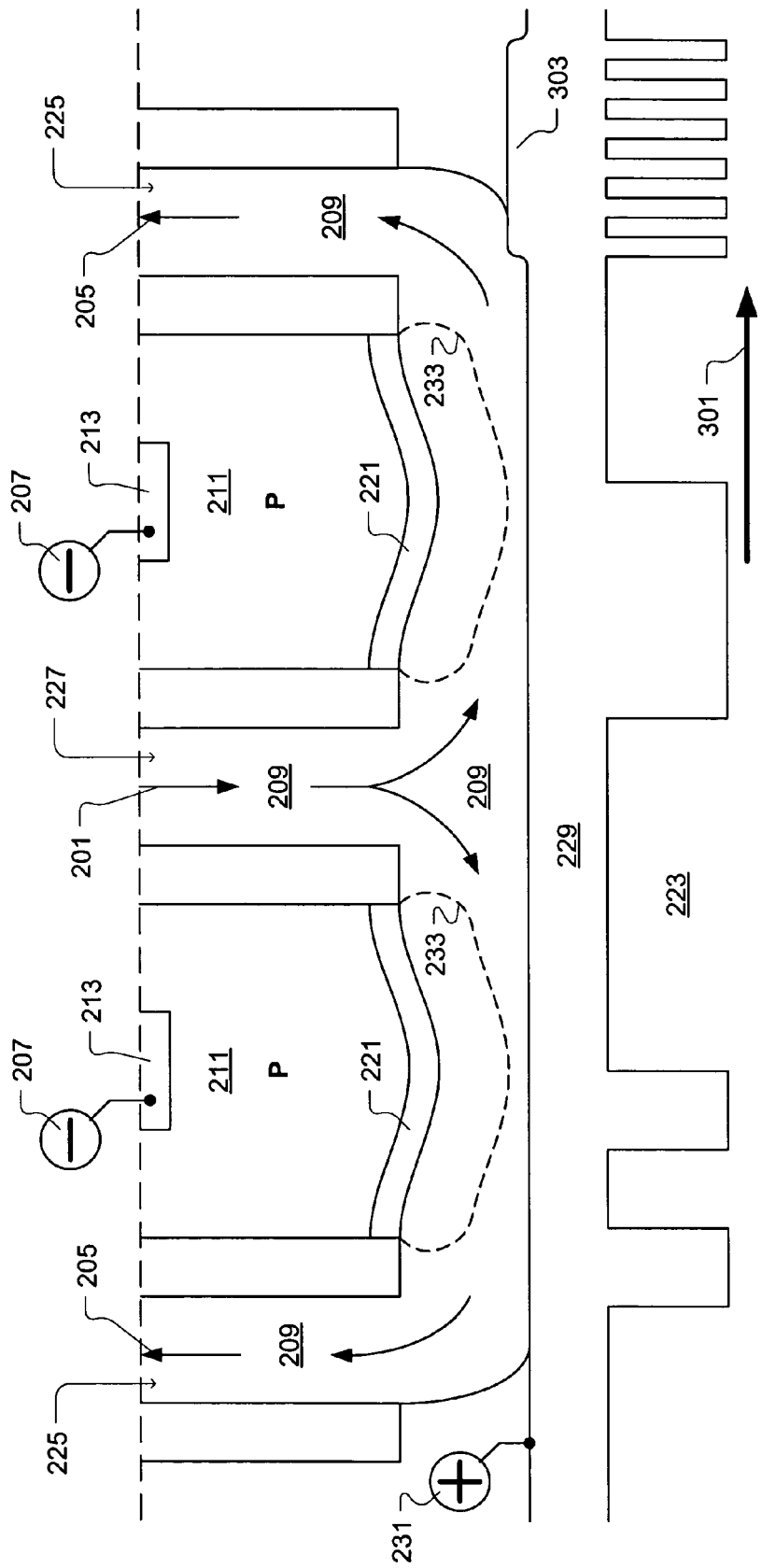

FIGS. 3A-3C are a series of illustrations showing traversal of the wafer 223 beneath the proximity head 200 during the confined area planarization process, in accordance with one embodiment of the present invention. Thus, the embodiment of FIGS. 3A-3C depicts the proximity head 200 as being stationary while the wafer 223 traverses beneath the proximity head 200 in a direction 301. However, it should be appreciated that the present invention is not limited to having a stationary proximity head 200 and a moving wafer 223. In another embodiment, the wafer 223 can be stationary and the proximity head 200 can move. In yet another embodiment, both the wafer 223 and the proximity head 200 can be moved with respect to one another.

With respect to FIGS. 3A-3C, attention should be paid to the topographic feature 303 that is within the level occupied by the critical boundary layer 233 beneath the membrane 221. FIG. 3A represents the proximity head 200 positioned just prior to traversal of the topographic feature 303 through the critical boundary layer 233. FIG. 3B represents the proximity head 200 positioned such that the topographic feature 303 is within the critical boundary layer 233 beneath the membrane 221. FIG. 3C represents the proximity head 200 positioned just after traversal of the topographic feature 303 through the critical boundary layer 233, such that the topographic feature 303 has been planarized.

The closed-loop cathode half-cell, defined between the metalized topography 229 on the wafer 223 surface and the cathode 213 within the electrolyte 211, functions to plate metal cations, e.g., $Cu^{++}$, as the metal cations pass from the topographical feature 303 through the membrane 221 to the cathode 213 under the influence of the bias voltage 231/207. The distance between the wafer 223 and the membrane 221 is controlled by the deionized water 209 flow rate and electrolyte solution 211 pressure (P). The relative velocity of the wafer 223 with respect to the proximity head 200 is set to provide a desired amount of planarization. More specifically, the exposure duration of the topographic feature 303 to the critical boundary layer combined with the etch rate determines how much of the topographic feature 303 is removed during its traversal beneath the proximity head 200, i.e., through the critical boundary layer 233. The etch rate is a function of the pH of the deionized water within the critical boundary layer 233 and the applied bias voltage 231/207. It should be understood that the pH of the deionized water within the critical boundary layer 233 is set by the composition of the membrane 221, i.e., by the functional groups within the membrane 221.

During traversal of the wafer 223 beneath the proximity head 200, the metalized topography 229 on the top surface of the wafer 223 is electrically connected to one or more electrodes. In one embodiment, two electrodes are used to contact the metalized topography 229 on the top surface of the wafer 223. Each these two electrode is defined to be moved to electrically connect to and disconnect from the wafer 223. It should be appreciated that movement of the two electrodes to connect to and disconnect from the wafer 223 can be performed in a number of ways. For example, in one embodiment, the two electrodes an be moved linearly in a plane aligned with the wafer 223. In another embodiment, the two electrodes having a sufficient elongated shape and being oriented in a coplanar arrangement with the wafer 223 can be moved in a rotational manner to contact the wafer 223.

It should also be appreciated that the shape of the two electrodes can be defined in a number of ways. For example, in one embodiment, the two electrodes can be substantially rectangular in shape. In another embodiment, each of the two electrodes can have a wafer contacting edge defined to follow a curvature of the wafer 223 periphery. In yet another embodiment, the two electrodes can be C-shaped. It should be understood that the two electrodes of the present embodiment are independently controllable.

In the present embodiment the wafer 223 is made to traverse beneath the proximity head 200 such that the long dimension (LD) of the proximity head 200 is substantially perpendicular to a virtual line extending between the two electrodes. As the wafer 223 moves beneath the proximity head 200, the electrode farther from the proximity head 200 is controlled to be electrically connected to the metalized topography 229 on the top surface of the wafer 223. Also, as the wafer 223 moves beneath the proximity head 200, the electrode closer to the proximity head 200 is controlled to be electrically disconnected from the metalized topography 229 on the top surface of the wafer 223. Connection of the two electrodes to the wafer 223 in the manner described above enables a current distribution present at the portion of the wafer 223 in exposure to the critical boundary layer 233 to be optimized. Additionally, connection of the two electrodes to the wafer 223 in the manner described above enables each electrode to be disconnected from the wafer 223 as the meniscus of deionized water 209 traverses thereover.

Although the present invention is described with respect to use of a single proximity head 200, it should be understood that other embodiments may utilize multiple proximity heads 200. For example, if it is desirable to increase the traversal rate of the wafer 223 beneath the proximity head 200, multiple proximity heads 200 may be positioned in a back-to-back manner to enable sufficient planarization. Additionally, the proximity head 200 may be followed by another proximity head defined to perform rinsing and drying operations. Furthermore, in one embodiment the confined area planarization provided by the proximity head 200 of the present invention may be used to achieve a uniform (planarized) layer of metal, e.g., Cu, remaining on the wafer 223. This uniform layer may be on the order of 1000 Angstroms to 2000 Angstroms thick in some embodiments. The wafer 223 having the uniform (planarized) layer of metal thereon, can then be processed through a separate final etch process to clear a necessary thickness of the remaining metal.

It should be appreciated that the confined area planarization process afforded by the proximity head 200 of the present invention does not require application of mechanical pressure/stress to the wafer 223, as is common in conventional chemical mechanical planarization (CMP) processes. Additionally, it should be appreciated that the separation distance between the membrane 221 of the proximity head 200 and the wafer 223 in the present invention does not rely upon a relative velocity between the membrane 221 and the wafer 223. Rather, the separation distance between the membrane 221 and the wafer 223 in the present invention is controlled by the flow rate of deionized water 209 between the membrane 221 and the wafer 223 and by the electrolyte solution 211 pressure (P) behind the membrane 221. Thus the boundary layer is formed and maintained generally independently of the head-wafer relative velocity, and removal rates can be then controlled by residence time of the head relative to the wafer independent of boundary layer thickness control.

Figure 2E:
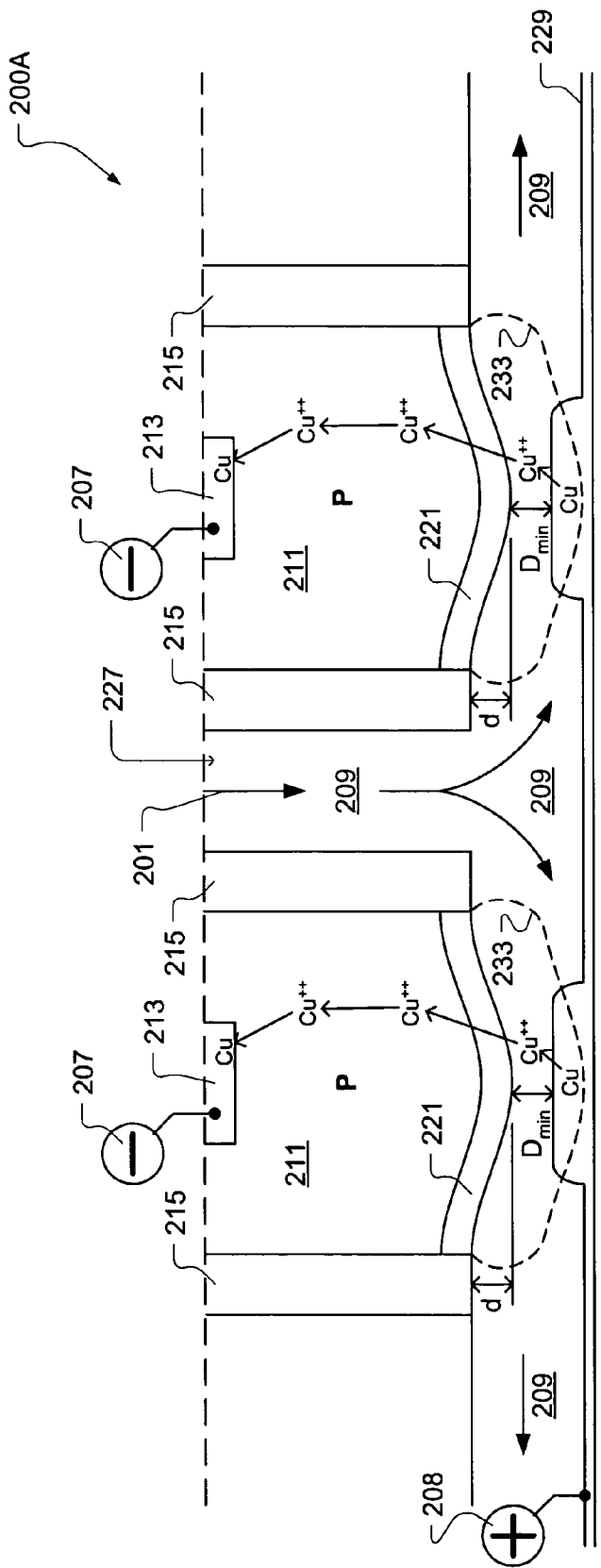
FIG. 2E is an illustration showing a proximity head that does not incorporate a vacuum channel, in accordance with one embodiment of the present invention.

It should be appreciated that the boundary layer can be formed by forcing water across the membrane without the use of a vacuum return line to remove the water (i.e., the wafer can be flooded and the overflow collected in a drain in the process chamber). FIG. 2E is an illustration showing a proximity head 200A that does not incorporate a vacuum channel, in accordance with one embodiment of the present invention. The proximity head 200 features previously described with respect to FIG. 2A are also included in the proximity head 200A of FIG. 2E, with the exception of the vacuum return channel 225. In the embodiment of FIG. 2E, the deionized water 209 flows over the membrane 221, over the wafer 223, and eventually flows off the wafer 223 edge to a collection means.

During the confined area planarization process, as described above with respect to the proximity head 200, the flow of cations from the wafer 223 to the cathode 213 creates a measurable electric current. Thus, this electric current flows from the wafer 223 (anode) to the cathode 213. An electric current measuring device can be connected between the wafer 223 and the cathode 213 to measure the electric current flowing from the wafer 223 to the cathode 213. It should be appreciated that the electric current flowing from the wafer 223 to the cathode 213 is a function of the working contact area between the critical boundary layer 233 and the metalized topography 229 on the surface of the wafer 223. The working contact area represents the area of the metalized topography 229 within the critical boundary layer 233. Thus, the working contact area represents the area of the metalized topography 229 from which metal cations, e.g., $Cu^{++}$, are being removed.

As the higher portions of the metalized topography 229 are removed, i.e., planarized, during the confined area planarization process, the working contact area will increase, i.e., the wafer surface area within the critical boundary layer 233 will increase. Therefore, as the higher portions of the metalized topography 229 are removed, the flow of metal cations between the wafer 223 and the cathode 213 will increase. This increased flow of metal cations represents a measurable increase in electric current flowing from the wafer 223 to the cathode 213. Eventually, when the wafer becomes planarized, the working contact area becomes substantially constant. When the working contact area becomes substantially constant, the flow of metal cations from the wafer 223 to the cathode 213 become substantially constant, i.e., each portion of the wafer surface contributes equally to the flow of metal cations. Therefore, when the working contact area becomes substantially constant, the flow of electric current between the wafer 223 and the cathode 213 becomes substantially constant. Thus, a leveling-off of the electric current between the wafer 223 and the cathode 213 is an indication that the wafer 223 is planarized. Hence, the electric current between the wafer 223 and the cathode 213 can be monitored to detect an endpoint of the planarization process.

Figure 4:
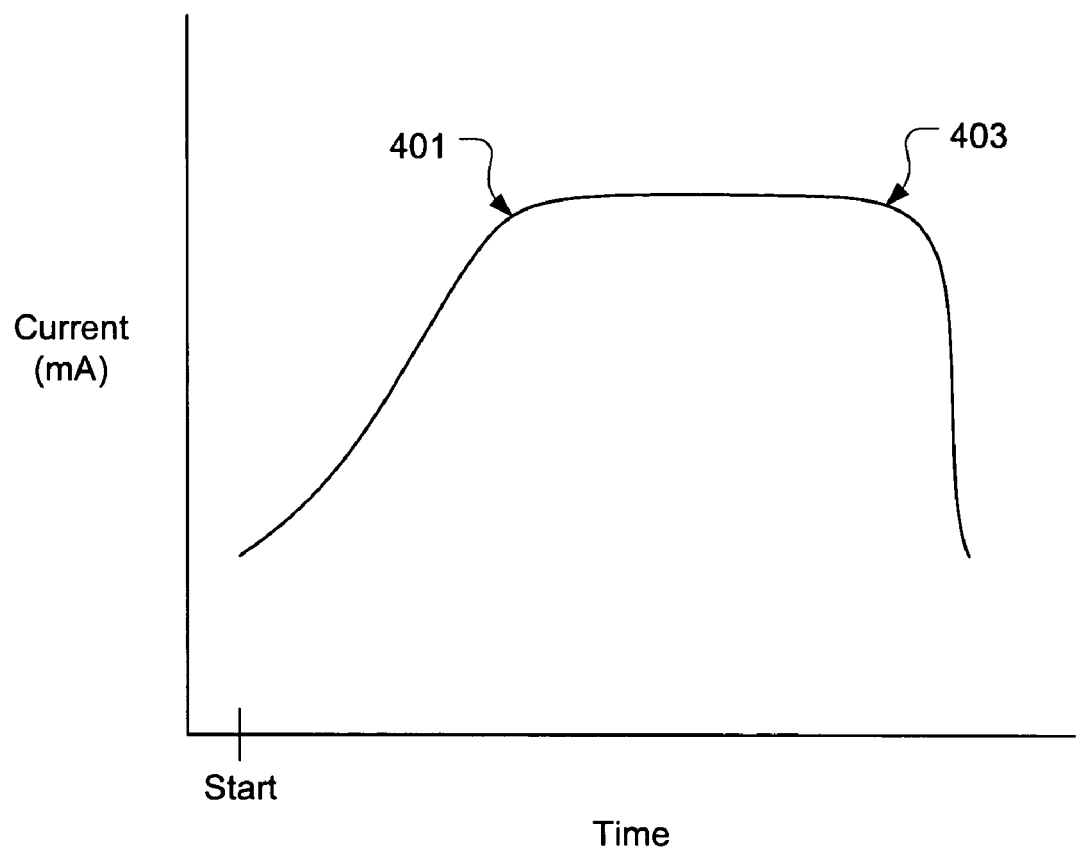
FIG. 4 is an illustration showing a chart of electric current flowing between the wafer and the cathode as a function of time during the confined area planarization process, in accordance with one embodiment of the present invention.

FIG. 4 is an illustration showing a chart of electric current flowing between the wafer 223 and the cathode 213 as a function of time during the confined area planarization process, in accordance with one embodiment of the present invention. For ease of discussion, the electric current flowing between the wafer 223 and the cathode 213 will be referred to as the "current." From the start of the confined area planarization process, the current increases steadily as the wafer is planarized. As discussed above, the steady increase in current is due to exposure of more metalized topography 229 to the critical boundary layer 233 as the higher portions of the metalized topography 229 become planarized.

As the metalized topography 229 approaches a planarized state, the current begins to level off. When the wafer 223 becomes substantially planarized, each portion of the wafer surface will be exposed in a substantially equal manner to the critical boundary layer 233. Thus, when the wafer 223 becomes substantially planarized, the current will level off as indicated by a location 401 on the curve of FIG. 4. The location 401 represents the endpoint of the confined area planarization process. If the confined area planarization process continues beyond the time corresponding to the location 401, the current will remain substantially level. Eventually, however, enough metal will be removed from the wafer 223 such that electrically non-conductive layers underlying the previously present metalized topography 229 will be exposed. When the electrically non-conductive layers are exposed, the current will drop as indicated by a location 403 on the curve of FIG. 4. Thus, the location 403 represents the breakthrough point of the confined area planarization process.

In one embodiment, the confined area planarization process may be continued until the breakthrough point is reached. However, in another embodiment, the confined area planarization process may be continued until the planarization endpoint is reached. Because the metalized topography 229 is removed in a top-down manner, it is generally expected that a planarized layer of metal will remain on the wafer surface when the planarization endpoint is reached. Upon reaching the planarization endpoint of the confined area planarization process, the wafer 223 may be subjected to a separate final etch process, e.g., wet clean etch process or plasma etch back process, to uniformly remove a required thickness of the remaining metal present on the wafer surface.

Figure 5:
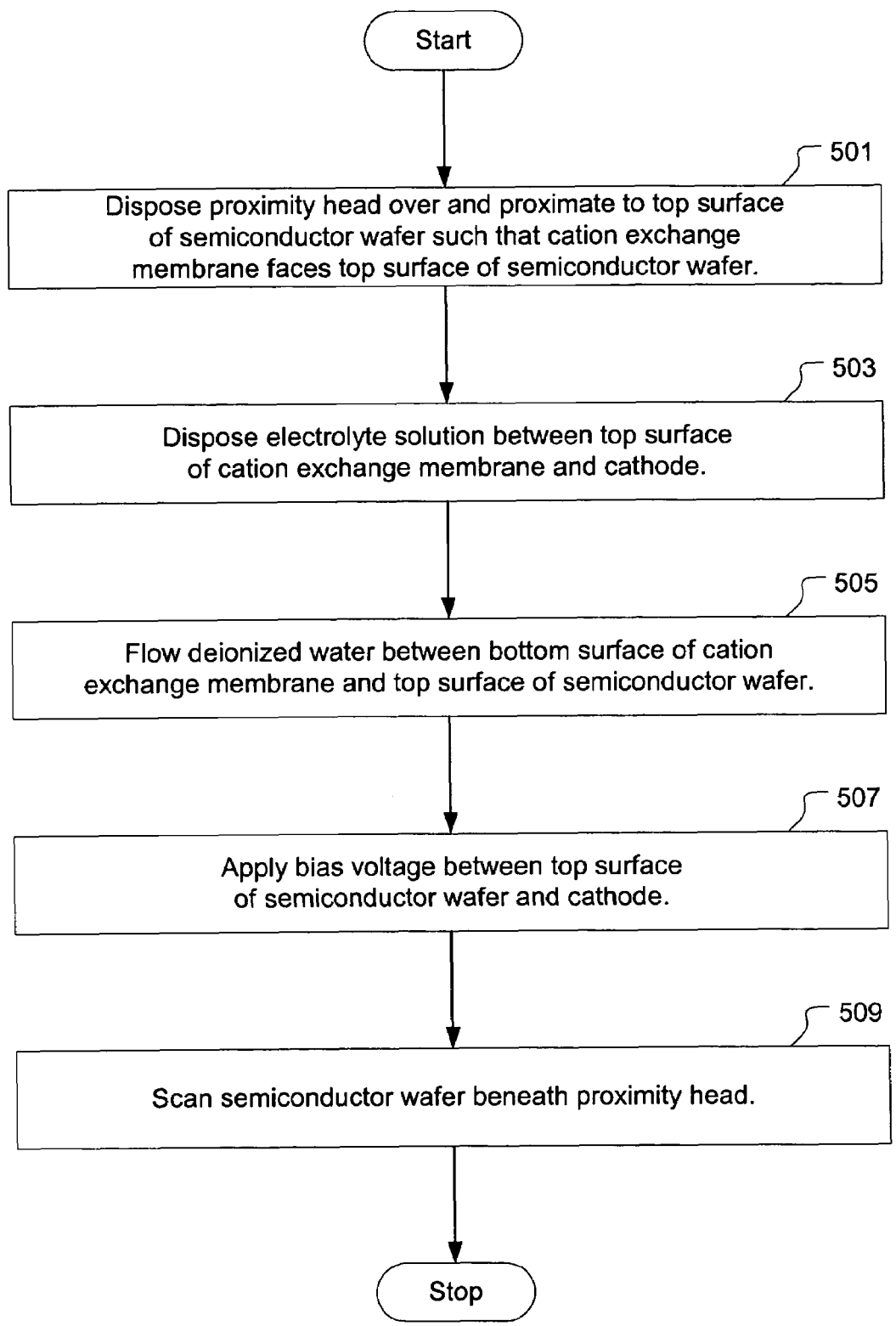
FIG. 5 is an illustration showing a flowchart of a method for confined area planarization of a semiconductor wafer, in accordance with one embodiment of the present invention.

FIG. 5 is an illustration showing a flowchart of a method for confined area planarization of a semiconductor wafer, in accordance with one embodiment of the present invention. It should be understood that the method of FIG. 5 is intended to be performed using the proximity head 200 described above with respect to FIGS. 2A-4. The method includes an operation 501 for disposing a proximity head over and proximate to a top surface of a semiconductor wafer such that a cation exchange membrane faces the top surface of the semiconductor wafer. In an operation 503, an electrolyte solution is disposed between a top surface of the cation exchange membrane and a cathode. An operation 505 is performed to flow deionized water between a bottom surface of the cation exchange membrane and the top surface of the semiconductor wafer. The method further includes an operation 507 for applying a bias voltage between the top surface of the semiconductor wafer and the cathode, such that cations liberated from the top surface of the semiconductor wafer are influenced to travel through the deionized water, through the cation exchange membrane, and through the electrolyte solution to the cathode.

In one embodiment the flow rate of the deionized water is controlled such that the cation exchange membrane flexes toward the top surface of the semiconductor wafer under the influence of a Bernoulli force without contacting the top surface of the semiconductor wafer. The flexing of the cation exchange membrane causes a pH modified region of the deionized water proximate to the bottom surface of the cation exchange membrane, i.e., the above-described critical boundary layer 233, to be in contact with the top surface of the wafer. It should be understood that the pH modified region of the deionized water causes the cations to be liberated from the top surface of the semiconductor wafer.

The method further includes an operation 509 for scanning the semiconductor wafer beneath the proximity head such that a metalized topography present on the top surface of the semiconductor wafer is removed in a substantially uniform top-down manner. Additionally, the method can include a process for detecting a planarization endpoint. The planarization endpoint detection process includes monitoring of a flow of electric current through the cation exchange membrane. The planarization endpoint corresponds to a leveling-off of the monitored flow of electric current through the cation exchange membrane. It should be understood that the flow of electric current through the cation exchange membrane is monitored by measuring an electric current between the top surface of the semiconductor wafer and the cathode.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A proximity head for confined area planarization, comprising:
   a chamber defined to maintain an electrolyte solution;
   a cathode disposed within the chamber in exposure to the electrolyte solution;
   a cation exchange membrane disposed over a lower opening of the chamber, a top surface of the cation exchange membrane to be in direct exposure to the electrolyte solution to be maintained within the chamber;
   a fluid supply channel defined to expel fluid at a first location adjacent to a lower surface of the cation exchange membrane; and
   a vacuum channel defined to provide suction at a second location adjacent to the lower surface of the cation exchange membrane such that fluid to be expelled from the fluid supply channel at the first location is made to flow over the lower surface of the cation exchange membrane to the second location, wherein the second location is opposite the first location relative to a width of the cation exchange membrane across the lower opening of the chamber,
   wherein the cation exchange membrane is defined to be controllably flexible in a direction away from the lower opening of the chamber in response to a Bernoulli effect caused by the flow of the fluid over the lower surface of the cation exchange membrane from the first location to the second location.

2. A proximity head for confined area planarization as recited in claim 1, wherein the chamber is annular-shaped and the fluid supply channel is defined within a center of the chamber, the vacuum channel being annular-shaped and defined to surround the chamber.

3. A proximity head for confined area planarization as recited in claim 1, wherein the cation exchange membrane is defined to enable cation flow through the membrane and block anion flow through the membrane while providing bulk fluid confinement.

4. A proximity head for confined area planarization as recited in claim 1, wherein the cation exchange membrane is defined as a polymer matrix including functional groups that form a network of channels through which cations can travel.

5. A proximity head for confined area planarization as recited in claim 1, wherein the cation exchange membrane is capable of locally influencing a pH of the fluid to be made to flow over the lower surface of the cation exchange membrane such that a critical boundary layer is formed beneath the lower surface of the cation exchange membrane, the critical boundary layer capable of causing cations to be liberated from an anodic material when placed in exposure to the critical boundary layer without being placed in contact with the cation exchange membrane.

6. A proximity head for confined area planarization as recited in claim 1, wherein the cation exchange membrane is defined to be controllably flexible in response to a pressure applied by the electrolyte solution on the top surface of the cation exchange membrane.

7. A proximity head for confined area planarization, comprising:
  a chamber defined to maintain an electrolyte solution;
  a cathode disposed within the chamber in exposure to the electrolyte solution;
  a cation exchange membrane disposed over a lower opening of the chamber and in direct exposure to the electrolyte solution to be maintained within the chamber;
  a fluid supply channel defined to expel fluid at a first location adjacent to a lower surface of the cation exchange membrane;
  a vacuum channel defined to provide suction at a second location adjacent to the lower surface of the cation exchange membrane such that fluid to be expelled from the fluid supply channel at the first location is made to flow over the lower surface of the cation exchange membrane to the second location, wherein the second location is opposite the first location relative to a width of the cation exchange membrane across the lower opening of the chamber; and
  an electric current measuring device connected to measure an electric current flow through the cation exchange membrane,
  wherein the cation exchange membrane is defined to be controllably flexible in a direction away from the lower opening of the chamber in response to a Bernoulli effect caused by the flow of the fluid over the lower surface of the cation exchange membrane from the first location to the second location.

8. A proximity head for confined area planarization as recited in claim 7, wherein the cation exchange membrane is capable of influencing a pH of the fluid to be made to flow over the lower surface of the cation exchange membrane such that a critical boundary layer is formed beneath the lower surface of the cation exchange membrane, the critical boundary layer capable of causing cations to be liberated from an anodic material when placed in exposure to the critical boundary layer.

9. A proximity head for confined area planarization as recited in claim 8, further comprising:
  a bias voltage supply connected between the cathode and the anodic material, the bias voltage supply defined to be controlled such that cations liberated from the anodic material are influenced to traverse through the cation exchange membrane through the electrolyte solution to the cathode.

10. A proximity head for confined area planarization as recited in claim 9, wherein traversal of the cations through the cation exchange membrane represents the electric current flow to be measured by the electric current measuring device.

11. A proximity head for confined area planarization as recited in claim 7, wherein the proximity head is defined to be positioned over and proximate to a top surface of a semiconductor wafer such that the fluid to be expelled from the fluid supply channel is made to flow between the top surface of the semiconductor wafer and the lower surface of the cation exchange membrane.

12. A proximity head for confined area planarization as recited in claim 11, wherein the cation exchange membrane is defined to be controllably flexible in a direction toward the top surface of the semiconductor wafer.

13. A proximity head for confined area planarization, comprising:
  a chamber defined to maintain an electrolyte solution;
  a cathode disposed within the chamber in exposure to the electrolyte solution;
  a cation exchange membrane disposed over a lower opening of the chamber, a top surface of the cation exchange membrane to be in direct exposure to the electrolyte solution to be maintained within the chamber; and
  a fluid supply channel defined to expel fluid at a location adjacent to a lower surface of the cation exchange membrane such that fluid to be expelled from the fluid supply channel is made to flow over the lower surface of the cation exchange membrane,
  wherein the proximity head is defined to be positioned over and proximate to a top surface of a semiconductor wafer such that the fluid to be expelled from the fluid supply channel is made to flow between the top surface of the semiconductor wafer and the lower surface of the cation exchange membrane,
  wherein the cation exchange membrane is defined to be controllably flexible in a direction away from the lower opening of the chamber in response to a Bernoulli effect caused by the flow of the fluid between the top surface of the semiconductor wafer and the lower surface of the cation exchange membrane, without contact between the cation exchange membrane and the semiconductor wafer.

* * * * *